(12) United States Patent
Hirai

(10) Patent No.: US 10,525,702 B2
(45) Date of Patent: Jan. 7, 2020

(54) COMPOSITE SUBSTRATE THAT PREVENTS FLEXIBLE PRINT CIRCUIT BOARD FROM PEELING OFF FROM DRIVE INTERCONNECT SUBSTRATE

(71) Applicant: BROTHER KOGYO KABUSHIKI KAISHA, Nagoya-shi (JP)

(72) Inventor: Keita Hirai, Nagoya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 15/992,755

(22) Filed: May 30, 2018

(65) Prior Publication Data

US 2019/0099997 A1    Apr. 4, 2019

(30) Foreign Application Priority Data

Sep. 29, 2017   (JP) ................. 2017-192153

(51) Int. Cl.
*B41J 2/14*    (2006.01)
*B41J 2/16*    (2006.01)
(Continued)

(52) U.S. Cl.
CPC ....... *B41J 2/04541* (2013.01); *B41J 2/04586* (2013.01); *H01L 25/16* (2013.01); *H01L 41/0475* (2013.01); *H01L 41/0973* (2013.01); *H05K 1/111* (2013.01); *H05K 1/144* (2013.01); *H05K 1/147* (2013.01); *H01L 23/49816* (2013.01); *H01L 23/49827* (2013.01);
(Continued)

(58) Field of Classification Search
CPC ........ B41J 2/14; B41J 2/16; B41J 2/45; H01L 41/00; H01L 41/09; H01L 41/47
USPC .................. 361/749; 347/20, 40, 50, 70, 71; 310/311, 365
See application file for complete search history.

(56) References Cited

U.S. PATENT DOCUMENTS 9,895,884 B2 *   2/2018   Miyajima ............... B41J 2/1707
2003/0025768 A1 *   2/2003   Koike .................. B41J 2/14233
347/68
(Continued)

FOREIGN PATENT DOCUMENTS

JP    2016-172345 A    9/2016
JP    2017-52135 A    3/2017
(Continued)

*Primary Examiner* — Xiaoliang Chen
(74) *Attorney, Agent, or Firm* — Merchant & Gould P.C.

(57) ABSTRACT

A composite substrate has a first substrate having a surface; a second substrate having a first surface and a second surface opposite to the first surface in a thickness direction and facing the surface of the first substrate with a gap therebetween, the second substrate extending in a longitudinal direction perpendicular to the thickness direction, the second substrate having first and second ends in the longitudinal direction, and a driver circuit being provided on the first surface; a flexible print circuit board has a portion bonded a position on the first substrate between the first end and the driver circuit, the bonding region being defined on the first surface, and a support member positioned between the surface of the first substrate and the second surface of the second substrate, the support member overlapping all of the bonding region, as viewed in the thickness direction.

12 Claims, 11 Drawing Sheets

(51) Int. Cl.
  *B41J 2/45* (2006.01)
  *H01L 41/00* (2013.01)
  *H01L 41/09* (2006.01)
  *H01L 41/47* (2013.01)
  *B41J 2/045* (2006.01)
  *H05K 1/14* (2006.01)
  *H05K 1/11* (2006.01)
  *H01L 25/16* (2006.01)
  *H01L 41/047* (2006.01)
  *H05K 1/18* (2006.01)
  *H01L 41/04* (2006.01)
  *H01L 41/187* (2006.01)
  *H01L 23/00* (2006.01)
  *H01L 23/498* (2006.01)

(52) U.S. Cl.
  CPC ........... *H01L 24/16* (2013.01); *H01L 41/042* (2013.01); *H01L 41/1876* (2013.01); *H01L 2224/16227* (2013.01); *H01L 2924/1426* (2013.01); *H01L 2924/35* (2013.01); *H05K 1/189* (2013.01); *H05K 2201/042* (2013.01); *H05K 2201/10083* (2013.01); *H05K 2201/10378* (2013.01); *H05K 2201/10734* (2013.01); *H05K 2201/2045* (2013.01)

(56) References Cited

U.S. PATENT DOCUMENTS

| | | | | |
|---|---|---|---|---|
| 2005/0275693 A1* | 12/2005 | Murata | B41J 2/14233 | 347/68 |
| 2005/0275695 A1* | 12/2005 | Murata | B41J 2/14233 | 347/70 |
| 2006/0176340 A1* | 8/2006 | Murata | B41J 2/14233 | 347/68 |
| 2006/0244787 A1* | 11/2006 | Enomoto | B41J 2/14233 | 347/63 |
| 2006/0274127 A1* | 12/2006 | Enomoto | B41J 2/14233 | 347/68 |
| 2007/0058004 A1* | 3/2007 | Enomoto | B41J 2/14233 | 347/68 |
| 2007/0211109 A1* | 9/2007 | Enomoto | B41J 2/14233 | 347/50 |
| 2008/0180490 A1* | 7/2008 | Murata | B41J 2/14233 | 347/70 |
| 2008/0218558 A1* | 9/2008 | Yamashita | B41J 2/04515 | 347/68 |
| 2009/0207213 A1* | 8/2009 | Tsuda | B41J 2/055 | 347/70 |
| 2009/0207214 A1* | 8/2009 | Yagi | B41J 2/14233 | 347/71 |
| 2009/0213182 A1* | 8/2009 | Yamanaka | B41J 2/14274 | 347/50 |
| 2010/0220150 A1* | 9/2010 | Hayashi | B41J 2/14209 | 347/49 |
| 2010/0220152 A1* | 9/2010 | Hayashi | B41J 2/14209 | 347/56 |
| 2010/0245474 A1* | 9/2010 | Okubo | B29C 70/80 | 347/44 |
| 2011/0102493 A1* | 5/2011 | Hayashi | B41J 2/14209 | 347/20 |
| 2011/0205314 A1* | 8/2011 | Hibino | B41J 2/14233 | 347/71 |
| 2011/0221822 A1* | 9/2011 | Hagiwara | B41J 2/14233 | 347/44 |
| 2011/0292130 A1* | 12/2011 | Hayashi | B41J 2/14032 | 347/54 |
| 2013/0130536 A1* | 5/2013 | Terasaka | H01R 12/79 | 439/350 |
| 2013/0258001 A1* | 10/2013 | Sato | B41J 2/14201 | 347/71 |
| 2014/0022305 A1* | 1/2014 | Kida | B41J 2/14314 | 347/50 |
| 2014/0092167 A1* | 4/2014 | Nishi | B41J 2/14233 | 347/20 |
| 2014/0267491 A1* | 9/2014 | Nakao | B41J 2/16538 | 347/29 |
| 2015/0042724 A1* | 2/2015 | Enomoto | B41J 2/14 | 347/50 |
| 2015/0258786 A1* | 9/2015 | Akahane | B41J 2/14233 | 347/65 |
| 2015/0273827 A1* | 10/2015 | Kondo | B41J 2/1433 | 347/50 |
| 2016/0027988 A1* | 1/2016 | Nagahata | H01L 41/0472 | 347/70 |
| 2016/0096367 A1* | 4/2016 | Togashi | B41J 2/1433 | 347/40 |
| 2016/0121609 A1* | 5/2016 | Owaki | B41J 2/14233 | 347/50 |
| 2016/0263887 A1* | 9/2016 | Tanaka | B41J 2/14233 | |
| 2017/0066239 A1* | 3/2017 | Hirai | B41J 2/1631 | |
| 2017/0066240 A1* | 3/2017 | Hirai | B41J 2/1646 | |
| 2017/0066241 A1* | 3/2017 | Naganuma | B41J 2/14233 | |
| 2017/0120589 A1* | 5/2017 | Miyagishi | B41J 2/1433 | |
| 2017/0144438 A1* | 5/2017 | Hayakawa | B81B 7/0006 | |
| 2017/0144442 A1* | 5/2017 | Tsukahara | B41J 2/14201 | |
| 2017/0157930 A1* | 6/2017 | Hashiguchi | B41J 2/14 | |
| 2017/0217177 A1* | 8/2017 | Takabe | H01L 41/0475 | |
| 2017/0225457 A1* | 8/2017 | Watanabe | B41J 2/04541 | |
| 2017/0274655 A1* | 9/2017 | Watanabe | B41J 2/055 | |
| 2018/0001635 A1* | 1/2018 | Tomimatsu | B41J 2/14233 | |

FOREIGN PATENT DOCUMENTS

JP 2017-136711 A 8/2017
WO 2016147634 A1 9/2016

* cited by examiner

COMPOSITE SUBSTRATE THAT PREVENTS FLEXIBLE PRINT CIRCUIT BOARD FROM PEELING OFF FROM DRIVE INTERCONNECT SUBSTRATE

CROSS REFERENCE TO RELATED APPLICATION

This application claims priority from Japanese Patent Application No. 2017-192153 filed Sep. 29, 2017. The entire content of the priority application is incorporated herein by reference.

TECHNICAL FIELD

The present disclosure relates to a composite substrate used for an inkjet head.

BACKGROUND

An inkjet head configured by bonding a channel forming substrate to a drive interconnect substrate is well known in the art. The two substrates are bonded together with adhesive while a gap is maintained between the top surface of the channel forming substrate and the bottom surface of the drive interconnect substrate. A drive circuit is disposed on the top surface of the drive interconnect substrate and a flexible printed circuit board is bonded to the drive interconnect substrate. The flexible printed circuit board is bonded to one longitudinal end of the drive interconnect substrate.

However, in the conventional inkjet head described above, the space formed between the channel forming substrate and the drive interconnect substrate extends beneath the area in which the flexible printed circuit board is bonded to the drive interconnect substrate. Consequently, the drive interconnect substrate is susceptible to breaking or bending and separating from the channel forming substrate during the process of pressing the flexible printed circuit board to the drive interconnect substrate to bond the flexible printed circuit board to the same.

In view of the foregoing, it is an object of the present disclosure to provide a composite substrate that comprises a first substrate and a second substrate arranged with a gap separating the two substrates from each other, and that is capable of reliably preventing the second substrate from breaking or from bending and separating from the first substrate when a flexible printed circuit board is pressed to the second substrate to be bonded to the same.

SUMMARY

According to one aspect, a composite substrate has: a first substrate having a surface; a second substrate having a first surface and a second surface opposite to the first surface in a thickness direction, the second substrate extending in a longitudinal direction perpendicular to the thickness direction, the second substrate having a first end and a second end in the longitudinal direction, the second surface facing the surface of the first substrate with a gap therebetween, and the second substrate being provided with a driver circuit on the first surface; a flexible print circuit board having a portion bonded to a position on the first surface between the first end and the driver circuit in the longitudinal direction, a bonding region being defined on the first surface as such a region to which the portion of the flexible print circuit board is bonded; and a support member provided between the surface of the first substrate and the second surface of the second substrate, the support member overlapping an entire part of the bonding region on the first surface, as viewed in the thickness direction

BRIEF DESCRIPTION OF THE DRAWINGS

The particular features and advantages of the embodiment(s) as well as other objects will become apparent from the following description taken in connection with the accompanying drawings, in which.

DETAILED DESCRIPTION

Figure 1:
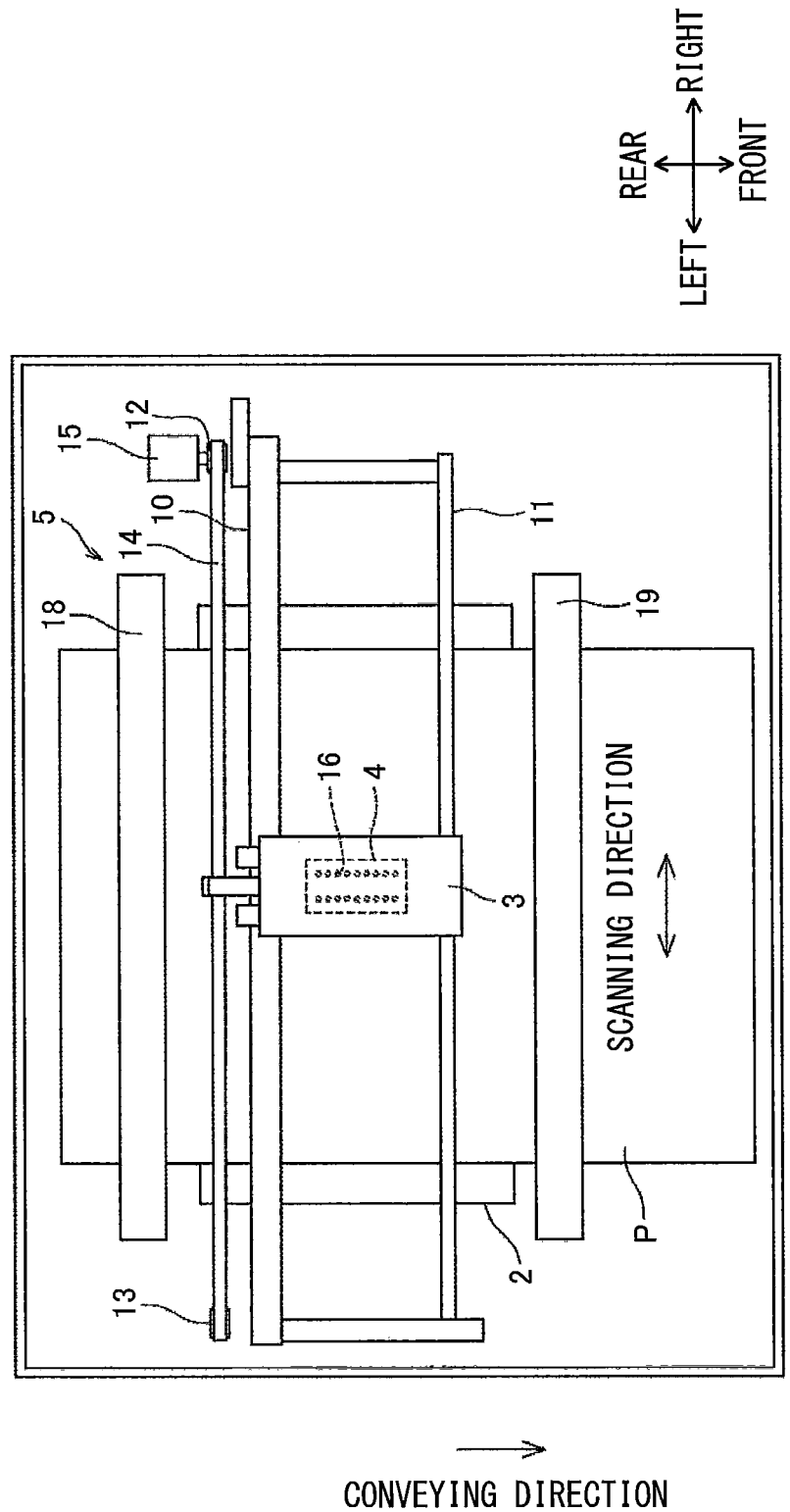
FIG. 1 is a schematic plan view showing an inkjet printer according to an embodiment.

Next, an embodiment will be described. FIG. 1 is a schematic plan view showing an inkjet printer 1 provided with an inkjet head 4 according to the embodiment. First, the overall structure of the inkjet printer 1 will be described with reference to FIG. 1. In the following description, the near side in the drawing of FIG. 1 will be defined as the top, the far side of the drawing will be defined as the bottom, the left side in the drawing will be defined as the left side and the right side in the drawing will be defined as the right side. In addition, the upstream side in a conveying direction described later will be defined as the rear side, and the downstream side of the conveying direction will be defined as the front side. It should be noted that a front-rear direction, a left-right direction, and an up-down direction are orthogonal to each other in the drawings.

Further, terminology related to directions such as up, down, left, right, front, and rear will be used as needed in the following description.

As shown in FIG. 1, the inkjet printer 1 includes a platen 2, a carriage 3, the inkjet head 4, and a conveying mechanism 5. A recording sheet P is supported on the top surface of the platen 2. The recording sheet P is a recording medium. Two guide rails 10 and 11 are provided above the platen 2. The guide rails 10 and 11 extend parallel to the left-right direction in FIG. 1 (a scanning direction). The carriage 3 is capable of reciprocating in the scanning direction along the guide rails 10 and 11 through a region opposing the platen 2. The carriage 3 is coupled to an endless belt 14. The endless belt 14 is looped around two pulleys 12 and 13. A carriage motor 15 drives the endless belt 14 to circulate about the pulleys 12 and 13. When the endless belt 14 is driven to circulate, the carriage 3 moves along the scanning direction.

The inkjet head 4 is mounted in the carriage 3 and moves along with the carriage 3 in the scanning direction. An ink cartridge (not shown) mounted in the inkjet printer 1 is connected to the inkjet head 4 by a tube. A plurality of nozzles 16 is formed in the bottom surface (the surface on the far side of FIG. 1) of the inkjet head 4. The inkjet head 4 ejects ink supplied from the ink cartridge through the nozzles 16 and onto the recording sheet P supported by the platen 2.

The conveying mechanism 5 has two conveying rollers 18 and 19 disposed on opposite sides of the platen 2 in the conveying direction. A motor (not shown) drives the conveying rollers 18 and 19 to rotate. The conveying rollers 18 and 19 of the conveying mechanism 5 convey the recording sheet P on the platen 2 in the conveying direction.

The inkjet printer 1 ejects ink from the inkjet head 4 toward the recording sheet P resting on the platen 2, as the inkjet head 4 reciprocates along with the carriage 3 in the scanning direction (the left-right direction in FIG. 1). In conjunction with this operation, the conveying rollers 18 and 19 convey the recording sheet P in the conveying direction. Through these operations, images, text, and the like are recorded on the recording sheet P.

<Inkjet Head 4>

Figure 2:
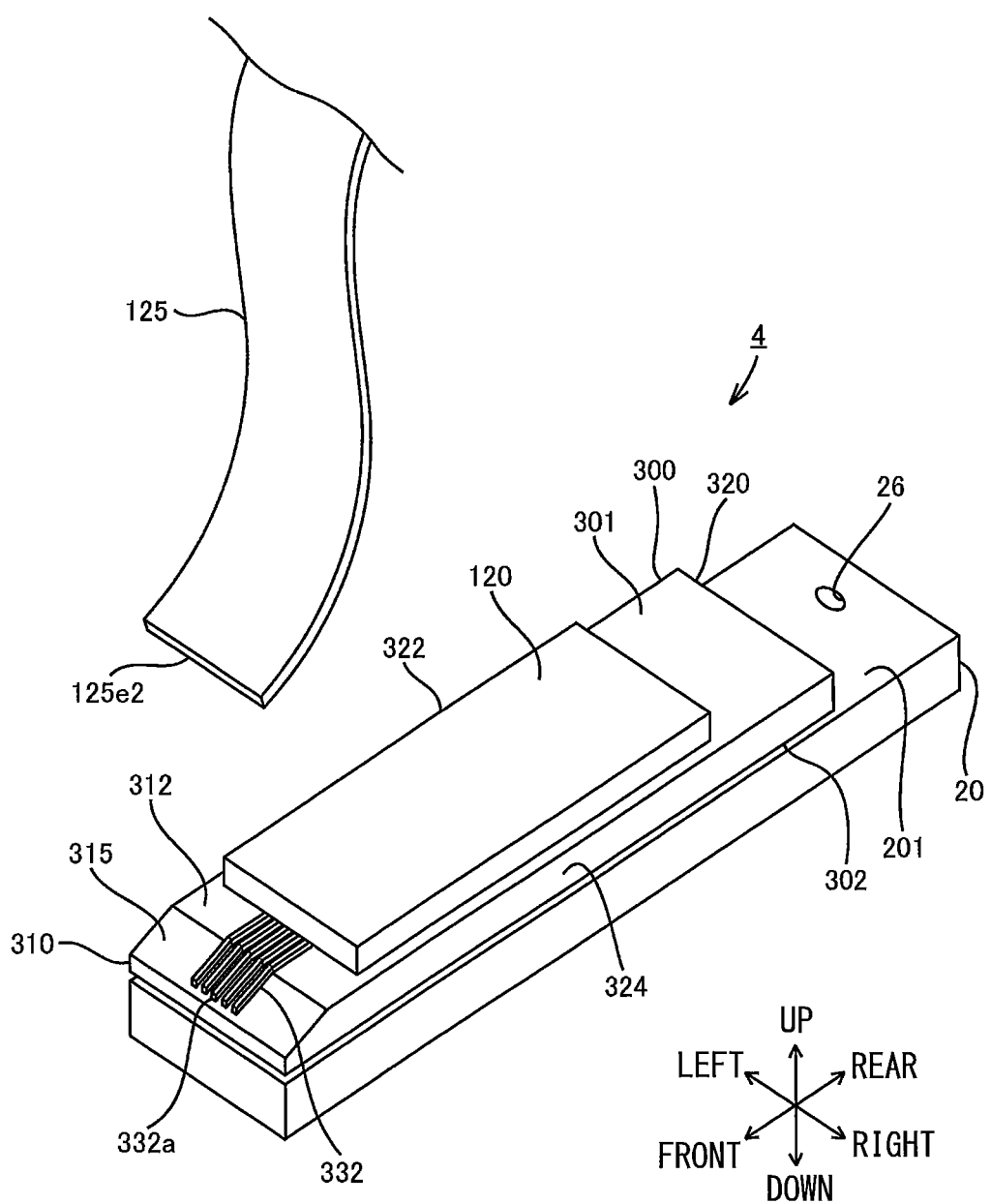
FIG. 2 is a perspective view of an inkjet head.
Figure 3:
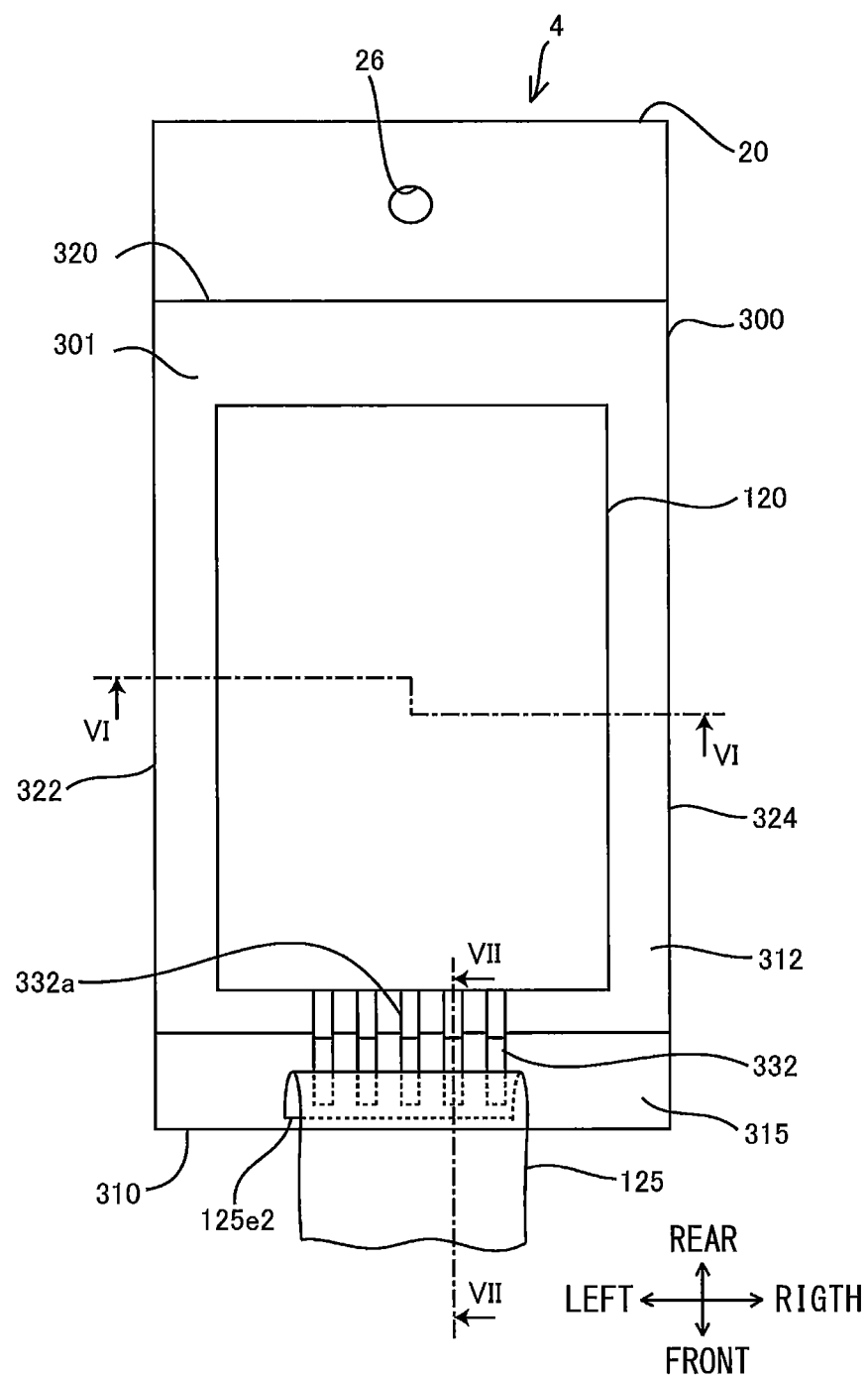
FIG. 3 is a plan view of an inkjet head.
Figure 4:
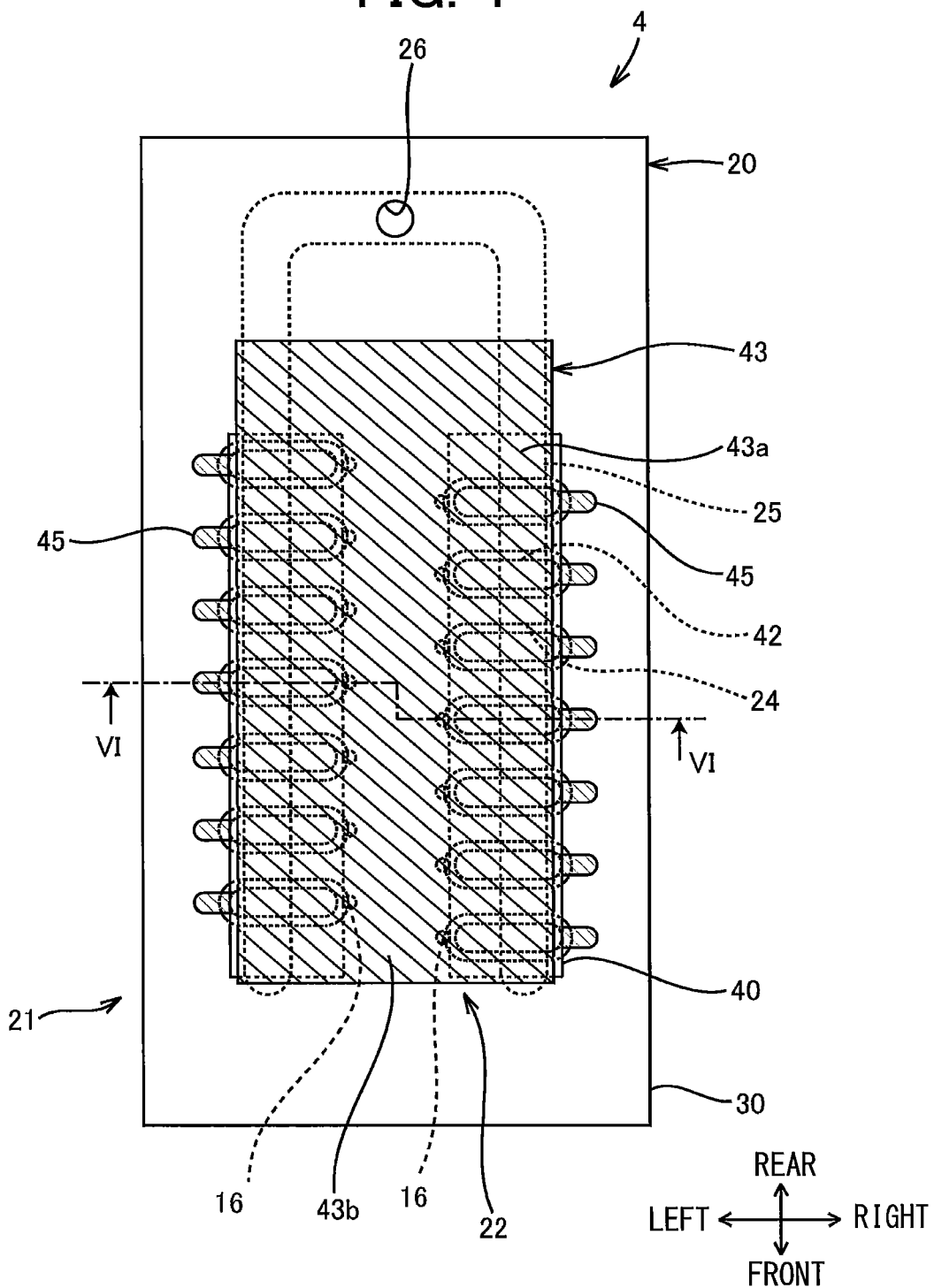
FIG. 4 is a plan view of an inkjet head (without a drive interconnect substrate)
Figure 5:
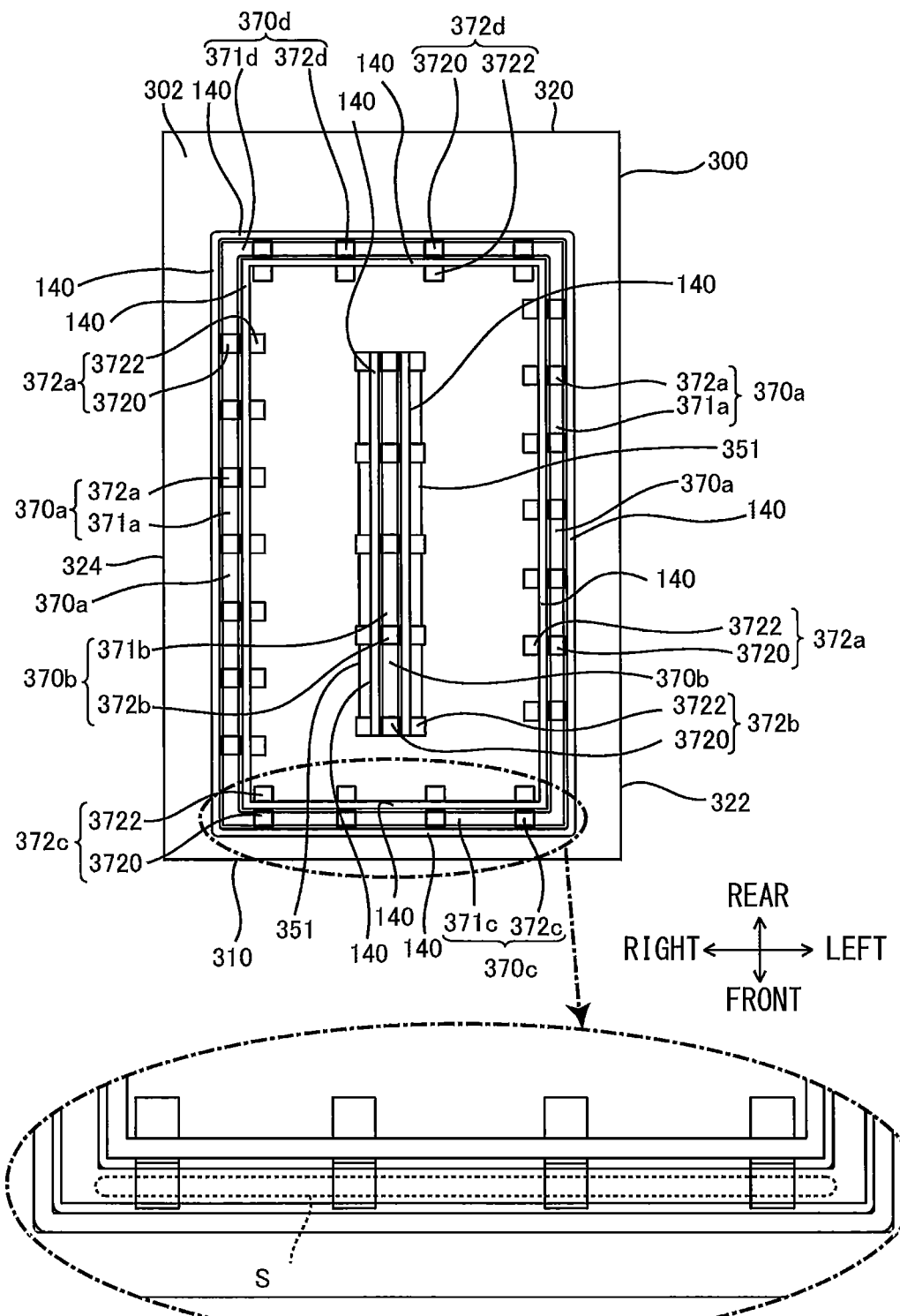
FIG. 5 is a bottom view of a drive interconnect substrate.
Figure 6:
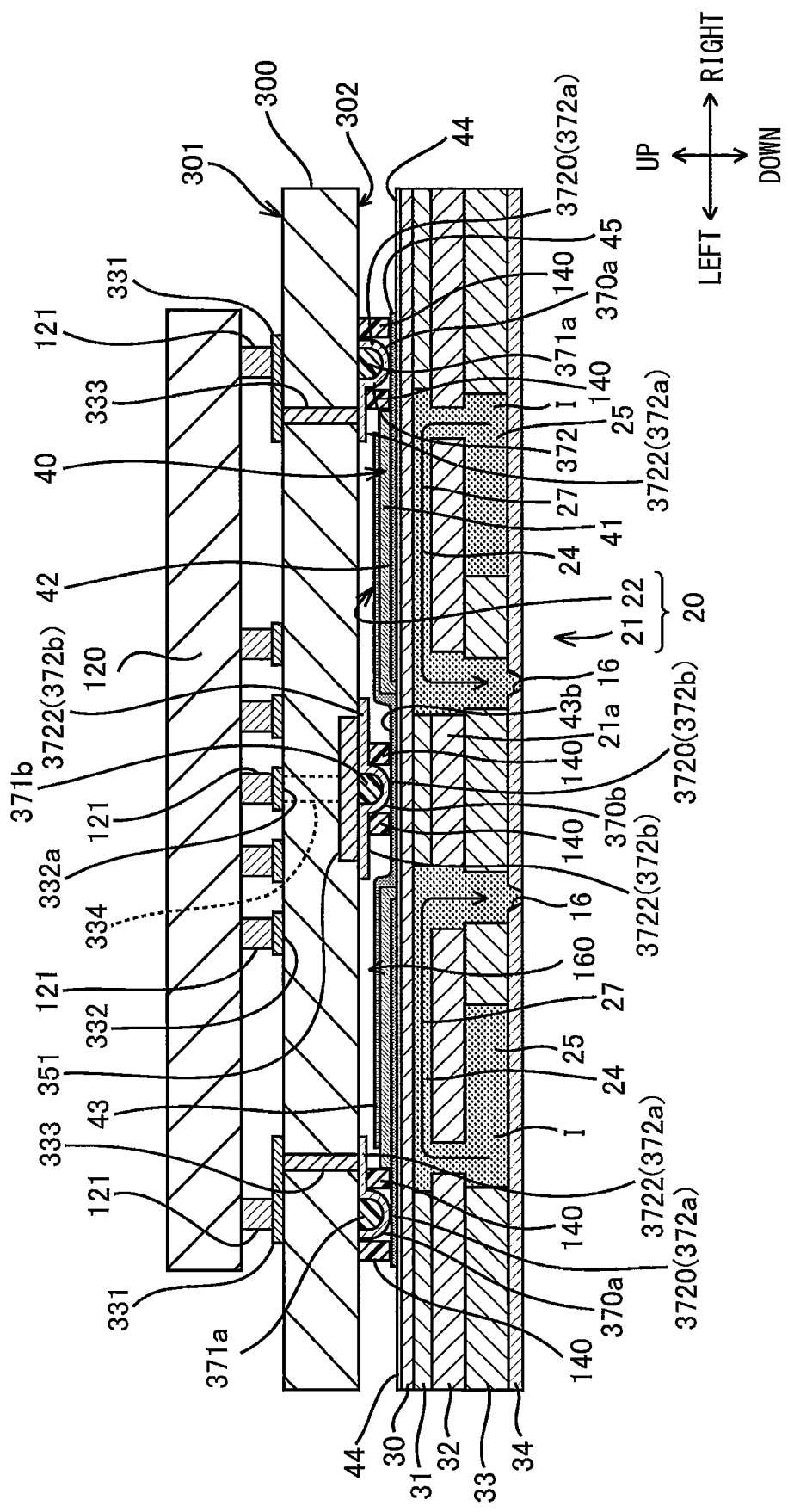
FIG. 6 is a cross-sectional view taken along the line VI-VI in FIG. 3.

Next, the inkjet head 4 will be described. FIGS. 2 and 3 are a perspective view and a plan view, respectively, of the inkjet head 4. FIG. 2 shows the state of the inkjet head 4 prior to a flexible printed circuit board 125 (described later) being bonded to a drive interconnect substrate 300 (described later). FIG. 3 shows the state of the inkjet head 4 after the flexible printed circuit board 125 has been bonded to the drive interconnect substrate 300. FIG. 4 is a plan view of the inkjet head 4 (and specifically a channel forming substrate 20 described later) without the drive interconnect substrate 300 shown in FIG. 2. FIG. 5 is a bottom view of the drive interconnect substrate 300. FIG. 6 is a cross-sectional view of the inkjet head 4 taken along the line VI-VI in FIG. 3. The letter "I" in FIG. 6 denotes ink accommodated in ink channels. As shown in FIG. 2, the inkjet head 4 includes a channel forming substrate 20, and the drive interconnect substrate 300.

As shown in FIG. 2, the channel forming substrate 20 has a general parallelepiped shape that is elongated in the front-rear direction. As shown in FIG. 6, the channel forming substrate 20 includes a channel unit 21 (a channel structure), and a piezoelectric actuator 22 disposed on the top surface of the channel unit 21.

<Channel Unit 21>

As shown in FIG. 6, the channel unit 21 has a layered structure comprising five plates 30-34. Multiple channel forming holes are formed in each of the plates 30-34. When the plates 30-34 are stacked together, the channel forming holes communicate with each other to form ink channels, as will be described below. Although not particularly limited to any material, the five plates 30-34 may be configured of metal plates formed of stainless steel or a nickel alloy steel, for example. In this embodiment, the plates 30-34 are made from single-crystal silicon substrates.

As shown in FIG. 4, an ink supply hole 26 is formed in the top surface of the channel unit 21. The ink supply hole 26 is connected to an ink cartridge (not shown). Two manifolds 25 are formed inside the channel unit 21. The manifolds 25 are elongated in the front-rear direction. Both manifolds 25 are connected to and share the single ink supply hole 26. Ink in the ink cartridge is supplied into the manifolds 25 through the ink supply hole 26.

As shown in FIGS. 2 and 6, the channel unit 21 has a plurality of the nozzles 16, and a plurality of pressure chambers 24. The nozzles 16 are formed in the nozzle plate 34, which is the bottommost layer of the channel unit 21, and are open in the bottom surface of the channel unit 21. The pressure chambers 24 are in communication with respective nozzles 16. As shown in FIG. 4, the nozzles 16 are arranged in the bottom surface of the channel unit 21 (the surface facing the far side of the drawing in FIG. 4) in two rows extending in the front-rear direction. Note that the nozzles 16 in the two nozzle rows are arranged so as to be staggered relative to each other in the front-rear direction, i.e., so that the positions of the nozzles 16 in one row are offset in the front-rear direction from the positions of the nozzles 16 in the other row.

In a plan view, the pressure chambers 24 have a general elliptical shape that is elongated in the left-right direction. The pressure chambers 24 are arranged along the same plane. The vibration plate 30 covers the tops of the pressure chambers 24. The pressure chambers 24 are also arranged in two rows that are staggered relative to each other along the conveying direction to correspond with the positions of the nozzles 16. Each pressure chamber 24 is in communication with the corresponding nozzle 16 at one longitudinal end of the pressure chamber 24. The positional relationships of the pressure chambers 24 and nozzles 16 are reversed between the left and right pressure chamber rows. That is, the nozzles 16 communicate with the right longitudinal ends of the corresponding pressure chambers 24 in the left pressure chamber row, while the nozzles 16 communicate with the left longitudinal ends of the corresponding pressure chambers 24 in the right pressure chamber row. With this arrangement, two nozzle rows are formed along the insides of the corresponding pressure chamber rows, as illustrated in FIG. 4.

The pressure chamber rows are arranged in positions that overlap the corresponding manifolds 25. Each pressure chamber 24 is in communication with the manifold 25 positioned directly beneath the pressure chamber 24. With this configuration, a plurality of individual ink channels 27 is formed in the channel unit 21. Each individual ink channels 27 branches off from the corresponding manifold 25 and passes through the corresponding pressure chamber 24 to arrive at the corresponding nozzle 16.

<Piezoelectric Actuator 22>

Next, the piezoelectric actuator 22 will be described. The piezoelectric actuator 22 is disposed on the top surface of the vibration plate 30 constituting the channel unit 21. As shown in FIGS. 4 and 6, the piezoelectric actuator 22 has two piezoelectric members 40, a plurality of individual electrodes 42, and a common electrode 43.

As shown in FIG. 6, an insulating layer 44 formed of an insulating material, such as a synthetic resin material, is formed over substantially the entire top surface of the vibration plate 30. The two piezoelectric members 40 are disposed on the top surface of the vibration plate 30 covered by the insulating layer 44. The piezoelectric members 40 are formed in rectangular shapes. The piezoelectric members 40 are oriented with their longitudinal dimensions aligned with the rows of pressure chambers 24 and cover the corresponding pressure chamber rows. The piezoelectric members 40 are formed of a material whose primary component is lead zirconate titanate (PZT). PZT is a ferroelectric solid solution of lead titanate and lead zirconate. Note that the piezoelectric members 40 may also be formed directly on the top surface of the vibration plate 30 covered by the insulating layer 44 through a well-known film formation technique, such as a sputtering method or a sol-gel method. Alternatively, the piezoelectric members 40 may be formed by pasting a thin green sheet to the vibration plate 30 after the green sheet has been sintered.

The plurality of individual electrodes 42 are formed in regions on the bottom surfaces of the piezoelectric members 40 that correspond to the pressure chambers 24. In a plan view, each individual electrode 42 has a general elliptical shape that is slightly smaller than the pressure chambers 24 and is arranged so as to confront the approximate center region of the corresponding pressure chamber 24. The individual electrodes 42 are electrically insulated from the vibration plate 30 by the insulating layer 44.

A plurality of individual drive terminals 45 are respectively connected to corresponding individual electrodes 42. Each of the individual drive terminals 45 is led over the insulating layer 44 from the corresponding individual electrode 42 toward the side opposite the corresponding nozzle 16 in the longitudinal direction of the individual electrode 42 (toward the outer side) to an area that does not oppose the pressure chamber 24. Thus, the plurality of individual drive terminals 45 are exposed on the outside of the piezoelectric members 40, as illustrated in FIGS. 4 and 6. Hence, the plurality of individual drive terminals 45 are arranged in rows extending in the front-rear direction along the outer left-right sides of two piezoelectric members 40. Individual drive bumps 370a described later are connected to corresponding individual drive terminals 45. Through the individual drive bumps 370a, a prescribed drive voltage is applied individually to the individual electrodes 42.

The common electrode 43 is formed across both piezoelectric members 40 so as to cover the entire top surfaces of the piezoelectric members 40. In FIG. 4, the common electrode 43 covering the two piezoelectric members 40 is depicted with hatching. Specifically, the common electrode 43 has two electrode parts 43a formed over the entire top surfaces of the respective piezoelectric members 40, and a connecting part 43b formed in the region on the top surface of the vibration plate 30 between the two piezoelectric members 40.

The connecting part 43b is elongated in the front-rear direction, extending along the long sides of the two rectangular piezoelectric members 40. The connecting part 43b is electrically insulated from the vibration plate 30 by the insulating layer 44. Further, since the connecting part 43b is formed on the top surface of the vibration plate 30, the vertical position of the connecting part 43b is lower than the two electrode parts 43a formed on the top surfaces of the piezoelectric members 40. As illustrated in the cross-sectional view of FIG. 6, the common electrode 43 is shaped with a concave depression at the connecting part 43b. The connecting part 43b opposes a partitioning part 21a of the channel unit 21 that partitions the two rows of pressure chambers 24. Hence, the connecting part 43b is disposed in a region on the top surface of the vibration plate 30 that does not oppose pressure chambers 24.

The connecting part 43b is connected to a common drive bump 370b described later and maintained at a bias potential (the ground potential in this embodiment).

As shown in FIG. 6, the portions of the piezoelectric members 40 interposed between each of the individual electrodes 42 and the common electrode 43 (hereinafter called "piezoelectric elements 41") are the portions that deform when drive voltages are applied to the corresponding individual electrodes 42 and apply ejection energy to ink inside the corresponding pressure chambers 24, as will be described below. In this embodiment, by arranging a single piezoelectric member 40 across the plurality of pressure chambers 24 belonging to one row of pressure chambers, the piezoelectric elements 41 corresponding to this pressure chamber row are integrally configured. In addition, each of the plurality of piezoelectric elements 41 is polarized in the thickness direction.

When a drive voltage is applied to one of the individual electrodes 42, an electric potential difference is produced between the individual electrode 42 and the common electrode 43, which is maintained at the ground potential. Consequently, an electric field along the thickness direction is generated in the portion of the piezoelectric member 40 (i.e., the piezoelectric element 41) between the individual electrode 42 and common electrode 43. Since the direction of this electric field is equivalent to the direction of polarization in the piezoelectric element 41, the piezoelectric element 41 expands in its thickness direction and contracts along its planar direction. This contraction of the piezoelectric element 41 forces the vibration plate 30 that covers the pressure chamber 24 to warp into a convex shape toward the pressure chamber 24 side, decreasing the capacity of the pressure chamber 24. As a result, pressure (ejection energy) is applied to the ink in the pressure chamber 24, causing an ink droplet to be ejected from the corresponding nozzle 16.

<Drive Interconnect Substrate 300>

As shown in FIG. 2, the drive interconnect substrate 300 has a general rectangular parallelepiped shape that is elongated in the front-rear direction, similar to the channel forming substrate 20. The drive interconnect substrate 300 has a top surface 301 and a bottom surface 302, and includes a front end 310, a rear end 320, a left side 322, and a right side 324. As shown in FIGS. 2 and 6, the drive interconnect substrate 300 is arranged relative to the channel forming substrate 20 such that the bottom surface 302 of the drive interconnect substrate 300 opposes but is separated from the top surface 201 of the channel forming substrate 20 (the surface on the piezoelectric actuator 22 side). The drive interconnect substrate 300 is bonded to the channel forming substrate 20. The drive interconnect substrate 300 is formed of the same material as the material of the channel forming substrate 20, i.e., a single-crystal silicon substrate in this embodiment. The drive interconnect substrate 300 has approximately the same width (left-right dimension) as that of the channel forming substrate 20.

<Bottom Surface 302 of the Drive Interconnect Substrate 300>

As shown in FIG. 5, the bottom surface 302 of the drive interconnect substrate 300 has a rectangular shape in a plan (bottom) view. The drive interconnect substrate 300 is arranged so as to oppose the top surface of the vibration plate 30 constituting the channel unit 21, with the left side 322 and right side 324 (i.e., the long sides of the drive interconnect substrate 300) aligned with the rows of pressure chambers 24, and is bonded to the vibration plate 30 so as to cover the tops of the two piezoelectric members 40.

As described above, the plurality of individual drive terminals 45 are arranged on the top surface of the vibration plate 30 and led out from the corresponding individual electrodes 42 to regions on both sides of the two piezoelectric members 40 with respect to the left-right direction, as illustrated in FIG. 4.

In other words, the pluralities of individual drive terminals 45 are formed on the top surface of the vibration plate 30 on the left-right outer sides of the two piezoelectric members 40. In addition, the connecting part 43b of the common electrode 43 described above is arranged on the top surface of the vibration plate 30 in the region between the two piezoelectric members 40.

As shown in FIGS. 5 and 6, a bottom-surface embedded interconnect 351 is formed in the bottom surface 302 of the drive interconnect substrate 300 that opposes the vibration plate 30. A plurality of bumps 370 and a plurality of pairs of spacers 140 are also provided on the bottom surface 302 that confronts the vibration plate 30 and protrude downward therefrom.

<Bottom-Surface Embedded Interconnect 351>

At least a portion of the bottom-surface embedded interconnect 351 is embedded in the drive interconnect substrate 300. In this embodiment, the entire bottom-surface embedded interconnect 351 is embedded in the bottom surface 302 of the drive interconnect substrate 300. As shown in FIG. 5, the bottom-surface embedded interconnect 351 extends along the front-rear direction (in a direction parallel to the nozzle rows). With this arrangement, the surface of the bottom-surface embedded interconnect 351 on the bottom surface 302 side is exposed in the bottom surface 302 of the drive interconnect substrate 300. The exposed surface of the bottom-surface embedded interconnect 351 is approximately flush with the bottom surface 302 of the drive interconnect substrate 300.

<Bumps 370>

As shown in FIG. 5, individual drive bumps 370a for forming connections with the individual drive terminals 45 are provided on the two edges of the drive interconnect substrate 300 along the left side 322 and right side 324 of the same. Further, a common drive bump 370b for forming connections with the connecting part 43b of the common electrode 43 is provided on the bottom-surface embedded interconnect 351 in the center region of the drive interconnect substrate 300.

Figure 7:
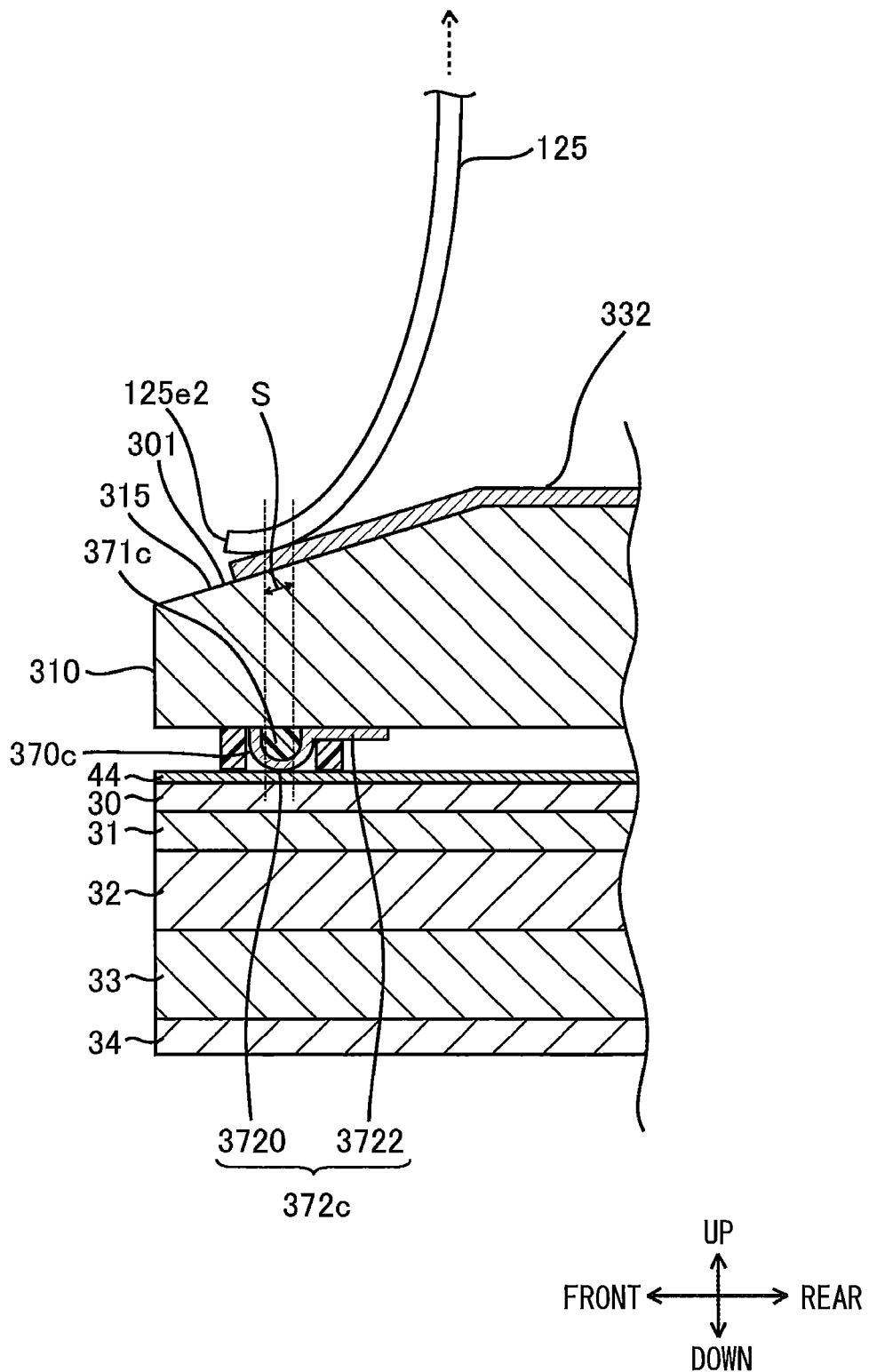
FIG. 7 is a cross-sectional view taken along the line VII-VII in FIG. 3.

Further, a front dummy bump 370c that does not connect to any electrodes is provided on the edge of the drive interconnect substrate 300 along the front end 310, and a rear dummy bump 370d that like the front dummy bump 370c does not connect to any electrodes is provided near the rear end 320 of the drive interconnect substrate 300. As shown in FIG. 7, the front dummy bump 370c is directly connected to the insulating layer 44 covering the vibration plate 30 and is not electrically connected to individual drive terminals 45 or the like. Similar to the front dummy bump 370c, the rear dummy bump 370d is directly connected to the insulating layer 44 covering the vibration plate 30 and is not electrically connected to the individual drive terminals 45 or the like. The front dummy bump 370c and the rear dummy bump 370d are examples of the support member.

In the following description, the individual drive bumps 370a, common drive bump 370b, front dummy bump 370c, and rear dummy bump 370d will be collectively called "bumps 370."

Each of the bumps 370 has a core part 371, and a plurality of conducting films 372. The core part 371 is formed of an insulating material, and preferably an elastic resin material. For example, the core part 371 may be formed of a photosensitive insulating resin or a thermosetting insulating resin such as polyimide resin, acrylic resin, phenolic resin, silicone resin, silicone-modified polyimide resin, or epoxy resin. Before the drive interconnect substrate 300 is connected to the channel forming substrate 20, the core part 371 has a columnar shape. A cross-section of the core part 371 taken orthogonal to its longitudinal direction is substantially semicircular or semielliptical. Each conducting film 372 includes a cover part 3720 that covers at least part of the surface of the core part 371, and one or two extension parts 3722 that extend from one or both ends of the cover part 3720 over the bottom surface 302 of the drive interconnect substrate 300 or the bottom-surface embedded interconnect 351. In this embodiment, the core parts 371 of all bumps 370 are formed of the same material.

In this embodiment, the core part 371 of the individual drive bump 370a (hereinafter called the "individual drive bump core part 371a") provided near the left side 322 extends in the front-rear direction along the edge of the left side 322. The conducting films 372 of this individual drive bump 370a (hereinafter called the "individual drive bump conducting films 372a") are arranged in the front-rear direction at positions corresponding one-on-one with the individual drive terminals 45 in the row on the left side of the channel forming substrate 20. In other words, the individual drive bump conducting films 372a are arranged in the front-rear direction at the same pitch as the corresponding individual drive terminals 45. Specifically, the distance between the centers of any two individual drive bump conducting films 372a in the left individual drive bump 370a that are adjacent to each other in the juxtaposed direction is equivalent to the distance between the centers of any two individual drive terminals 45 within the left row of individual drive terminals 45 that are adjacent to each other in the juxtaposed direction. For each individual drive bump conducting film 372a in the left individual drive bump 370a, the cover part 3720 covers the individual drive bump core part 371a, while the extension part 3722 extends rightward from the cover part 3720.

In the individual drive bump 370a provided near the right side 324, the individual drive bump core part 371a extends in the front-rear direction along the edge of the right side 324. The individual drive bump conducting films 372a are juxtaposed in the front-rear direction at positions corresponding one-on-one to the individual drive terminals 45 in the row on the right side of the channel forming substrate 20. Hence, the individual drive bump conducting films 372a in the right individual drive bump 370a are arranged in the front-rear direction at a pitch equivalent to the pitch of the corresponding individual drive terminals 45. Note that the pitch of the individual drive terminals 45 in the row of individual drive terminals 45 on the right is equivalent to the pitch of individual drive terminals 45 in the row of individual drive terminals 45 on the left. The cover part 3720 of each individual drive bump conducting film 372a in the right individual drive bump 370a also covers the corresponding individual drive bump core part 371a. However, unlike the extension parts 3722 in the left individual drive bump 370a that extend rightward from the cover parts 3720, the extension parts 3722 in the right individual drive bump 370a extend leftward from the corresponding cover parts 3720.

The core part 371 of the common drive bump 370b (hereinafter called the "common drive bump core part 371b") provided over the bottom-surface embedded interconnect 351 extends in the front-rear direction along the approximate left-right center region of the bottom-surface embedded interconnect 351. The conducting films 372 of the common drive bump 370b (hereinafter called the "common drive bump conducting films 372b") are juxtaposed in the front-rear direction. In each common drive bump conducting film 372b, the cover part 3720 covers the common drive bump core part 371b, and the extension parts 3722 extend in both left and right directions from the cover part 3720.

The core part 371 of the front dummy bump 370c (hereinafter called the "front dummy bump core part 371c") provided near the front end 310 extends in the left-right direction along the edge of the front end 310. Both ends of the front dummy bump core part 371c connect to the respective front ends of the left and right individual drive bump core parts 371a. The conducting films 372 of the front dummy bump 370c (hereinafter called the "front dummy bump conducting films 372c") are juxtaposed in the left-right direction at a greater pitch than the pitch of the left and right individual drive bump conducting films 372a. In other words, the distance between the centers of two front dummy bump conducting films 372c that neighbor each other in the juxtaposed direction is greater than the distance between the centers of any two individual drive bump conducting films 372a that neighbor each other in the juxtaposed direction. In each front dummy bump conducting film 372c, the cover part 3720 covers the front dummy bump core part 371c, and the extension part 3722 extends rearward from the cover part 3720. It should be noted that the left-right direction corresponds to a short side direction of the drive interconnect substrate which is orthogonal to the thickness direction and the longitudinal direction.

The core part 371 of the rear dummy bump 370d (hereinafter called the "rear dummy bump core part 371d") provided near the rear end 320 extends in the left-right direction along the rear end 320. The left and right ends of the rear dummy bump core part 371d are connected to the rear ends of the respective left and right individual drive bump core parts 371a. The conducting films 372 in the rear dummy bump 370d (hereinafter the "rear dummy bump conducting films 372d") are juxtaposed in the left-right direction at a greater pitch than the pitch of the left and right individual drive bump conducting films 372a. In other words, the distance between the centers of any two rear dummy bump conducting films 372d that neighbor each other in the juxtaposed direction is greater than the distance between the centers of any two individual drive bump conducting films 372a that neighbor each other in the juxtaposed direction. In each rear dummy bump conducting film 372d, the cover part 3720 covers the rear dummy bump core part 371d, and the extension part 3722 extends forward from the cover part 3720.

The four core parts 371 provided along the entire peripheral edge of the drive interconnect substrate 300 in this way surround the two piezoelectric members 40 when the drive interconnect substrate 300 is bonded to the channel forming substrate 20.

<Spacers 140>

Pairs of spacers 140 extend along the core part 371 of each bump 370 so that each corresponding core part 371 is interposed between a pair of spacers 140. Here, the extension part 3722 of each conducting film 372 in the individual drive bumps 370a, front dummy bump 370c, and rear dummy bump 370d is vertically interposed between the bottom surface 302 of the drive interconnect substrate 300 and one of the spacers 140. The extension parts 3722 of the conducting films 372 in the common drive bump 370b are vertically interposed between the bottom surface 302 of the bottom-surface embedded interconnect 351 and corresponding spacers 140. The spacers 140 are formed of a photosensitive resin that is cured when exposed to light. An insulating material is used for the spacers 140 in this embodiment, and is preferably a thermosetting resin that includes a photoinitiator whose primary component is an epoxy resin, acrylic resin, phenolic resin, polyimide resin, silicone resin, or styrene resin. From the perspective of chemical resistance, the most preferable resin includes epoxy resin as its primary component.

As shown in FIG. 2, a driver IC 120 is disposed on the top surface 301 of the drive interconnect substrate 300. Additionally, a plurality of first individual interconnects 331 (see FIG. 6) and a plurality of feed interconnects 332 are provided on the top surface 301 of the drive interconnect substrate 300.

As shown in FIGS. 2 and 3, the top surface 301 of the drive interconnect substrate 300 has a level region 312, and an inclined region 315. The inclined region 315 is positioned on the front side of the level region 312 and extends to the front end 310 in the front-rear direction. The level region 312 extends horizontally. The inclined region 315 extends horizontally in the left-right direction but slopes in the front-rear direction so as to approach the bottom surface 302 when progressing from the level region 312 to the front end 310.

The driver IC 120 and first individual interconnects 331 are arranged within the level region 312 of the top surface 301 in a plan view. The feed interconnects 332 extend along the level region 312 and inclined region 315 in the front-rear direction.

<First Individual Interconnects 331 and Feed Interconnects 332>

The first individual interconnects 331 (see FIG. 6) are provided with a one-on-one correspondence to the individual electrodes 42 on the channel forming substrate 20. Specifically, a plurality of first individual interconnects 331 are juxtaposed in the front-rear direction along each of the left and right sides of the level region 312.

The feed interconnects 332 are wires that supply, from the flexible printed circuit board 125 (described later), power for the driver IC 120, ground (GND) for the driver IC 120, drive signals (COM) for the individual electrodes 42, a bias voltage (ground) for the common electrode 43, and control signals for the driver IC 120. A plurality of the feed interconnects 332 is provided for the applications described above. In the following description, the feed interconnect 332 that applies a bias voltage (ground) to the common electrode 43 among the feed interconnects 332 will be called the "bias feed interconnect 332a."

The driver IC 120 is connected to the first individual interconnects 331 and feed interconnects 332. Specifically, the driver IC 120 has a plurality of terminals 121, as shown in FIG. 6, for electrically connecting the driver IC 120 to the first individual interconnects 331 and feed interconnects 332. Note that feed interconnects 332 other than the bias feed interconnect 332a are electrically connected to the driver IC 120 through the terminals 121. However, the bias feed interconnect 332a is not only electrically connected to the driver IC 120, but also to the common electrode 43 of the piezoelectric actuator 22. The driver IC 120 is bonded to the drive interconnect substrate 300 with adhesive (not shown).

<Through-Substate Interconnects>

As shown in FIG. 6, a plurality of individual drive through-substrate interconnects 333 and at least one common drive through-substrate interconnect 334 are formed in the drive interconnect substrate 300. The individual drive through-substrate interconnects 333 are provided with a one-on-one correspondence to the individual electrodes 42 in the channel forming substrate 20 and also a one-on-one correspondence to the first individual interconnects 331. The common drive through-substrate interconnect 334, on the other hand, is provided to correspond to the common electrode 43 of the channel forming substrate 20 and also the bias feed interconnect 332a.

The individual drive through-substrate interconnects 333 and the common drive through-substrate interconnect 334 extend vertically through the drive interconnect substrate 300, spanning between the top surface 301 and bottom surface 302 of the drive interconnect substrate 300.

Specifically, through-holes are provided in the drive interconnect substrate 300, penetrating the drive interconnect substrate 300 in the thickness direction thereof (i.e., vertically). The individual drive through-substrate interconnects 333 are formed by filling these through-holes with a conductive material to form wiring that conducts electricity between the top surface 301 and bottom surface 302 of the drive interconnect substrate 300.

The individual drive through-substrate interconnects 333 are electrically connected to corresponding first individual interconnects 331 on the top surface 301 of the drive interconnect substrate 300 and are electrically connected to the extension parts 3722 of corresponding individual drive bump conducting films 372a on the bottom surface 302 of the drive interconnect substrate 300.

As with the individual drive through-substrate interconnects 333, the common drive through-substrate interconnect 334 is formed by filling a through-hole that vertically penetrate the drive interconnect substrate 300 with a conductive material. The common drive through-substrate interconnect 334 is electrically connected to the bias feed interconnect 332a at the top surface 301 of the drive interconnect substrate 300 and is electrically connected to the bottom-surface embedded interconnect 351 at the bottom surface 302 of the drive interconnect substrate 300. Both the individual drive through-substrate interconnects 333 and common drive through-substrate interconnect 334 may be formed of copper (Cu) or another metal through a process such as electroplating or electroless plating.

The drive interconnect substrate 300 and the channel forming substrate 20 having the structure described above are bonded together as follows.

First, the drive interconnect substrate 300 is arranged so that the bottom surface 302 of the drive interconnect substrate 300 faces the top surface 201 of the channel forming substrate 20, with each individual drive bump conducting film 372a being positioned above a corresponding individual drive terminal 45, each common drive bump conducting film 372b being positioned above the connecting part 43b of the common electrode 43, and each front dummy bump conducting film 372c and rear dummy bump conducting film 372d being positioned above the insulating layer 44. In this state, the drive interconnect substrate 300 and the channel forming substrate 20 are pressed toward each other so that the distal edge of the individual drive bump core part 371a elastically deforms to a shape conforming to the surface shapes of the individual drive terminals 45, the distal edge of the common drive bump core part 371b elastically deforms to a shape conforming to the surface shape of the connecting part 43b, and the distal edges of the front dummy bump core part 371c and rear dummy bump core part 371d elastically deform to shapes conforming to the surface shape of the insulating layer 44. As a result, the individual drive bump conducting films 372a deform to follow the surface shape of the individual drive terminals 45 and become electrically bonded to the same, and the common drive bump conducting films 372b deform to follow the surface shape of the connecting part 43b and become electrically bonded to the common electrode 43. In addition, the front dummy bump conducting films 372c and rear dummy bump conducting films 372d deform to follow the surface shape of the insulating layer 44 and remain in contact with the same.

By connecting the individual drive bump conducting films 372a to the individual drive terminals 45 as described above, the driver IC 120 becomes electrically connected to the individual electrodes 42 of the piezoelectric elements 41 through the first individual interconnects 331, individual drive through-substrate interconnects 333, individual drive bump conducting films 372a, and individual drive terminals 45. Accordingly, drive signals can be supplied from the driver IC 120 to each piezoelectric element 41. Further, by connecting the common drive bump conducting films 372b to the connecting part 43b of the common electrode 43, a bias voltage can be supplied from the flexible printed circuit board 125 to the common electrode 43 of the piezoelectric actuator 22.

Further, the spacers 140 provided on both sides of the individual drive bumps 370a, the front dummy bump 370c, and the rear dummy bump 370d form a retaining section 160 between the channel forming substrate 20 and drive interconnect substrate 300. The retaining section 160 is an internal space in which the piezoelectric actuator 22 is provided.

<Flexible Printed Circuit Board and Dummy Bumps>

Figure 8A:
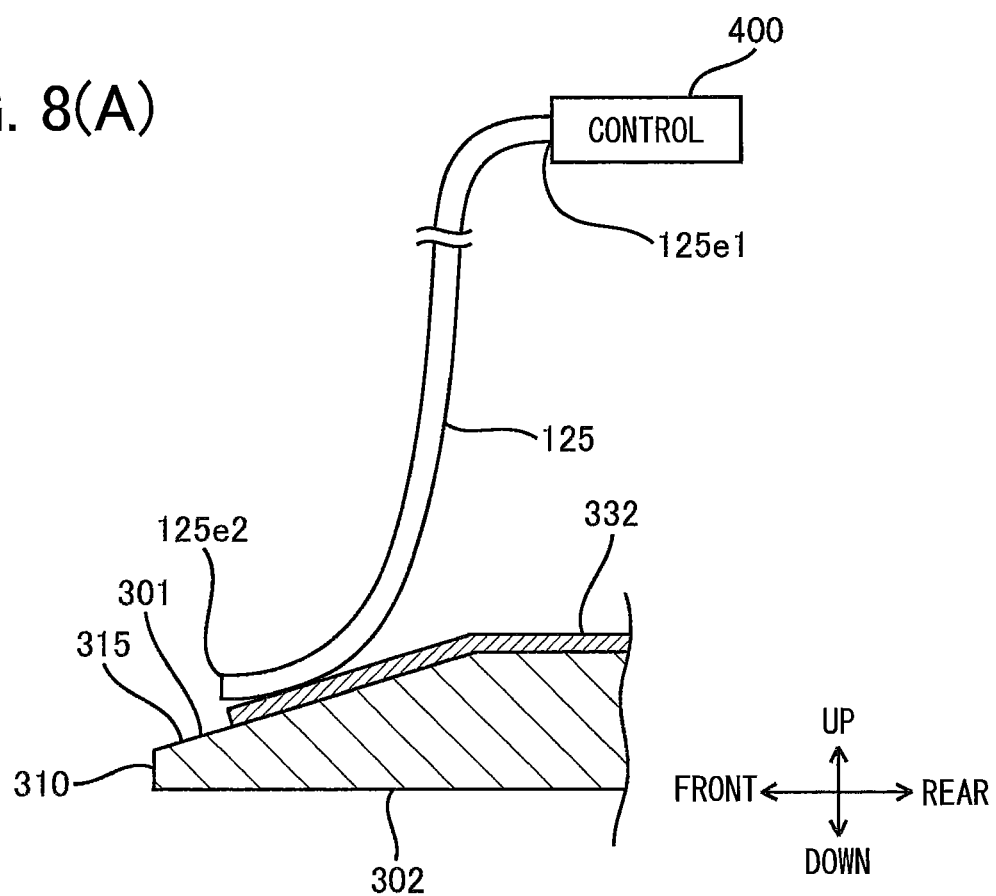
FIG. 8(A) is a view explaining a drive interconnect substrate according to an embodiment.

As shown in FIG. 3, the flexible printed circuit board 125 is bonded to the top surface 301 of the drive interconnect substrate 300 at a position between the front end 310 and the driver IC 120 in the front-rear direction. Specifically, as illustrated in FIG. 8(A), the flexible printed circuit board 125 has a proximal end 125e1 connected to a control circuit 400, and a distal end 125e2 constituting the opposite end from the proximal end 125e1. The flexible printed circuit board 125 is bonded to the drive interconnect substrate 300 in an area adjacent to the distal end 125e2 along its longitudinal direction (its direction of extension). At this time, the flexible printed circuit board 125 is bonded to the drive interconnect substrate 300 within the inclined region 315 constituting the top surface 301 of the drive interconnect substrate 300 such that an electric circuit (not shown) printed on the flexible printed circuit board 125 is electrically connected to the feed interconnects 332.

Bonding the flexible printed circuit board 125 to the inclined region 315 of the top surface 301 in this embodiment can reduce the bonding margin in a plan view, enabling the head to be made more compact.

In this embodiment, the direction in which the flexible printed circuit board 125 extends from the distal end 125e2 toward the proximal end 125e1 in the region that the flexible printed circuit board 125 is bonded to the drive interconnect substrate 300 matches the direction in which the drive interconnect substrate 300 extends from its front end 310 toward its rear end 320. Therefore, the overall inkjet head 4 can be made more compact. Further, since the radius of curvature of the flexible printed circuit board 125 in this region is not reduced, the flexible printed circuit board 125 is prevented from peeling off the drive interconnect substrate 300 due to stress generated by the bend in the flexible printed circuit board 125.

Figure 8B:
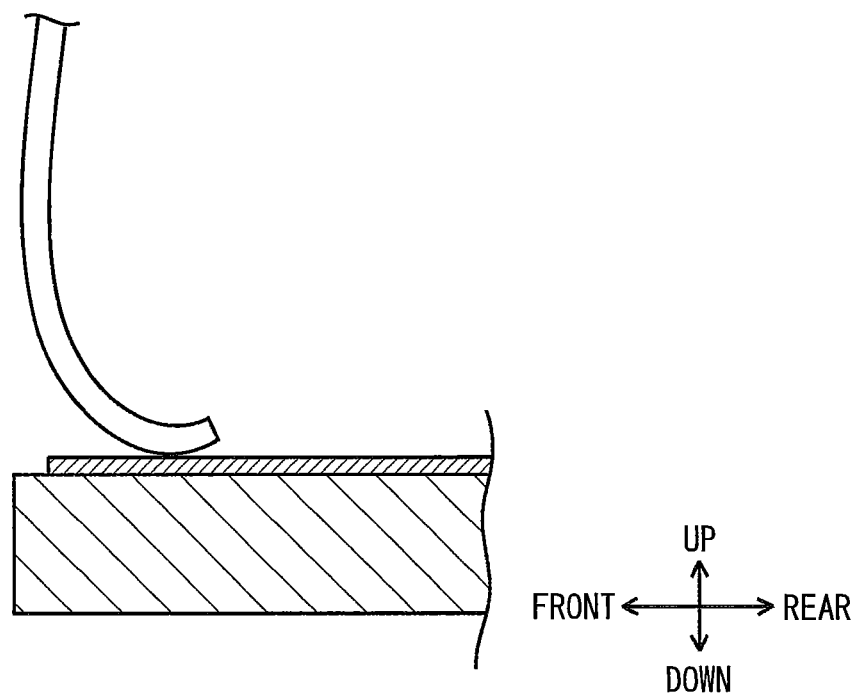
FIG. 8(B) is a view showing a comparison-1.
Figure 8C:
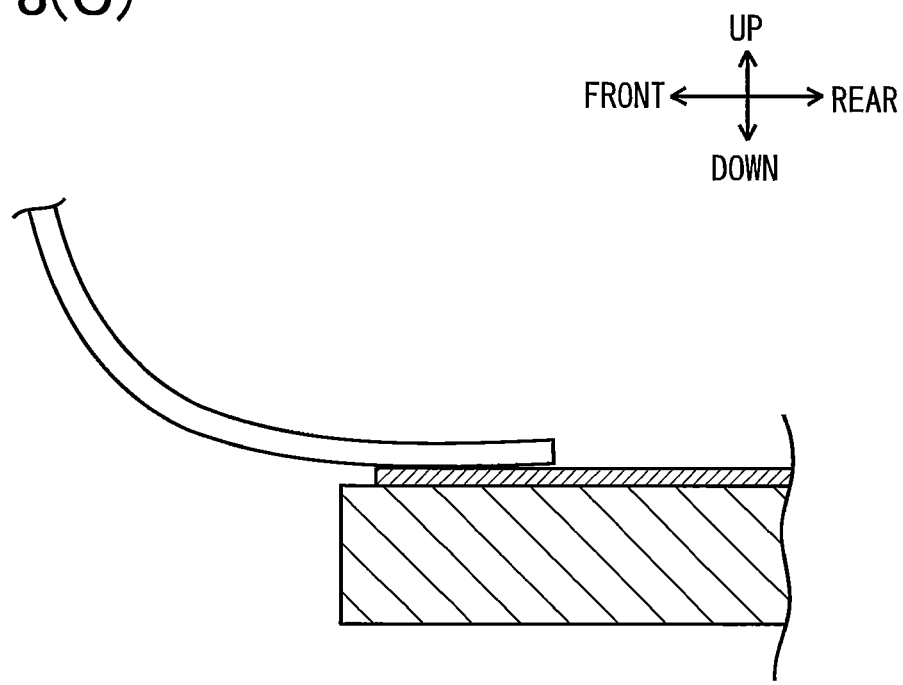
FIG. 8(C) is a view showing a comparison-2.

Next, the effects of this embodiment will be examined through comparative examples in which the top surface of the drive interconnect substrate is not provided with a sloped surface and, moreover, the flexible printed circuit board is bonded to the drive interconnect substrate while extending in the opposite direction from the embodiment. In the comparative example shown in FIG. 8(B), the bend in the flexible printed circuit board has a small radius of curvature, increasing the potential for the flexible printed circuit board 125 to peel off the drive interconnect substrate 300 due to stress generated by the bend. When the radius of curvature in the bend of the flexible printed circuit board is increased, as illustrated in FIG. 8(C), the flexible printed circuit board extends farther forward from the inkjet head. As a result, it is necessary to allocate more space around the inkjet head, which configuration is not conducive to making the overall printer compact.

Figure 8D:
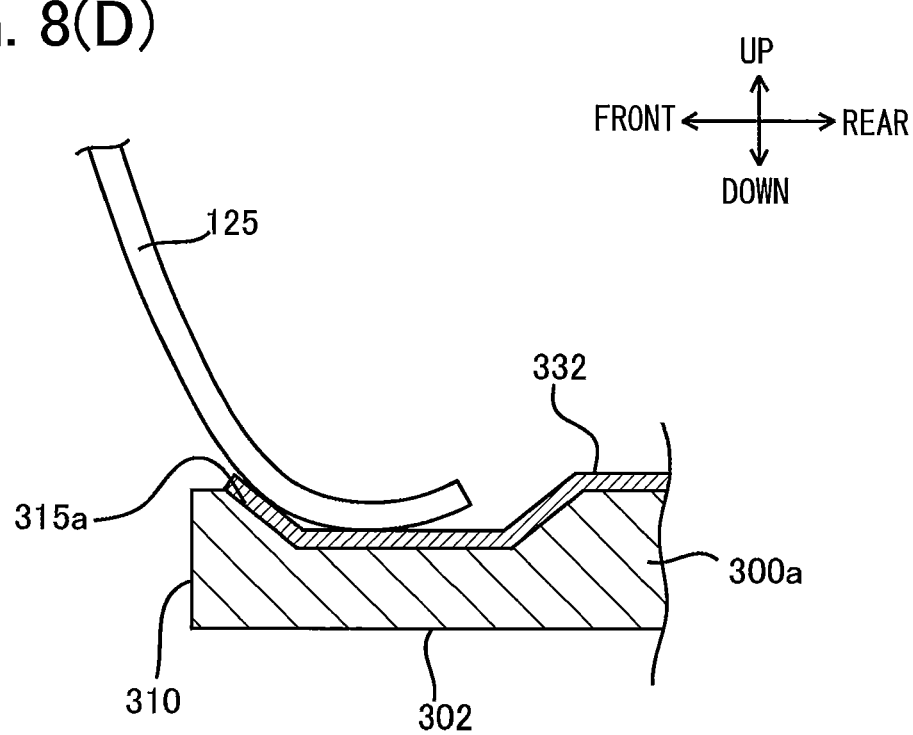
FIG. 8(D) is a view showing a modification of the embodiment.

In this embodiment, the inclined region 315 slopes so as to grow closer to the bottom surface 302 of the drive interconnect substrate 300 while approaching the front side, as illustrated in FIG. 8(A). However, in a drive interconnect substrate 300a according to the variation shown in FIG. 8(D), an inclined region 315a slopes so as to move away from the bottom surface 302 toward the front side. The flexible printed circuit board 125 may be bonded to the inclined region 315a having this configuration. However, the inclined region 315 of this embodiment that slopes so as to approach the bottom surface 302 toward the front side improves the ease of operations for bonding the flexible printed circuit board 125 to the inclined region 315 by facilitating insertion of a pressing jig.

When the drive interconnect substrate 300 is viewed vertically, as illustrated in FIGS. 5 and 7, the front dummy bump 370c overlaps the entire bonding area S on the top surface 301 at which the flexible printed circuit board 125 is bonded. In other words, in a vertical view, the front dummy bump core part 371c constituting the front dummy bump 370c is formed at a position for completing covering the bonding area S and has dimensions for completing covering the bonding area S. Hence, the front dummy bump 370c functions as a support column for maintaining the gap between the drive interconnect substrate 300 and channel forming substrate 20 while the flexible printed circuit board 125 is bonded to the drive interconnect substrate 300, reliably preventing the drive interconnect substrate 300 from breaking or from bending and peeling off the channel forming substrate 20.

Note that the rear dummy bump 370d may be omitted. However, it is preferable to provide the rear dummy bump 370d as described in the embodiment, since having the front dummy bump 370c and rear dummy bump 370d on opposite sides of the driver IC 120 from each other in the front-rear direction can maintain better weight balance in the inkjet head 4. Further, when a sealant is provided between the channel forming substrate 20 and drive interconnect substrate 300, the front dummy bump 370c and rear dummy bump 370d can both effectively prevent the sealant from flowing out of the region between the channel forming substrate 20 and drive interconnect substrate 300.

In the above embodiment, the bumps 370 are provided on the bottom surface 302 of the drive interconnect substrate 300 so as to protrude downward therefrom (toward the channel forming substrate 20). However, the bumps 370 may be formed on the top surface 201 of the channel forming substrate 20 so as to protrude upward therefrom (toward the drive interconnect substrate 300).

In the above embodiment, the front dummy bump 370c and rear dummy bump 370d are respectively provided with pluralities of front dummy bump conducting films 372c and rear dummy bump conducting films 372d. However, the front dummy bump 370c and rear dummy bump 370d need not be provided with the front dummy bump conducting films 372c and rear dummy bump conducting films 372d.

In the above embodiment, the inkjet head 4 is provided with the channel forming substrate 20, and the drive interconnect substrate 300, which is provided with the driver IC 120. The drive interconnect substrate 300 has the top surface 301 on one side in the thickness direction, and the bottom surface 302 on the opposite side of the top surface 301. The drive interconnect substrate 300 is elongated in a longitudinal direction that is orthogonal to its thickness direction, and has the front end 310 and the rear end 320 constituting opposite ends in the longitudinal direction. The drive interconnect substrate 300 is disposed such that the bottom surface 302 opposes but is separated from the top surface 201 of the channel forming substrate 20. The driver IC 120 is provided on the top surface 301 of the drive interconnect substrate 300. The flexible printed circuit board 125 is bonded to the top surface 301 of the drive interconnect substrate 300 between the front end 310 and the driver IC 120. The front dummy bump 370c is provided between the bottom surface 302 of the drive interconnect substrate 300 and the top surface 201 of the channel forming substrate 20. In a plan view, the front dummy bump 370c overlaps the entirety of the bonding area S at which the flexible printed circuit board 125 is bonded to the top surface 301. Since the front dummy bump 370c completely overlaps the bonding area S in the thickness direction, this arrangement can reliably prevent the drive interconnect substrate 300 from breaking or bending and peeling off the channel forming substrate 20 when the flexible printed circuit board 125 is bonded to the drive interconnect substrate 300.

In the above embodiment, the channel forming substrate 20 is further provided with the piezoelectric elements 41, and the individual electrodes 42 and common electrode 43 for applying drive signals to drive the piezoelectric elements 41. The piezoelectric elements 41 and the driving electrodes (the individual electrodes 42 and common electrode 43) are provided on the top surface of the channel forming substrate 20.

The first individual interconnects 331 and the bias feed interconnect 332a are formed on the drive interconnect substrate 300 and are electrically connected to the driver IC 120. The individual drive bumps 370a and common drive bump 370b are provided between the bottom surface 302 of the drive interconnect substrate 300 and the top surface 201 of the channel forming substrate 20. Each of the individual drive bumps 370a has an individual drive bump core part 371a formed of resin, and individual drive bump conducting films 372a provided so as to cover at least part of the individual drive bump core part 371a. The individual drive bump conducting films 372a are electrically connected to both a corresponding first individual interconnect 331 and a corresponding individual electrode 42.

The common drive bump 370b has a common drive bump core part 371b formed of a resin, and common drive bump conducting films 372b arranged so as to cover at least part of the common drive bump core part 371b. The common drive bump conducting films 372b are electrically connected to both the bias feed interconnect 332a and the common electrode 43. The front dummy bump core part 371c is formed of the same material as the individual drive bump core part 371a and common drive bump core part 371b. With this construction, the front dummy bump 370c can be manufactured in the same process with the individual drive bumps 370a and common drive bump 370b.

More specifically, the plurality of piezoelectric elements 41 are provided on the top surface 201 of the channel forming substrate 20. Further, the plurality of individual electrodes 42 for individually driving the piezoelectric elements 41 are provided on the top surface 201 of the channel forming substrate 20. The individual electrodes 42 are arranged in rows extending in the front-rear direction. The drive interconnect substrate 300 is provided with first individual interconnects 331 having a one-on-one correspondence with the individual electrodes 42.

The first individual interconnects 331 are arranged in rows extending in the front-rear direction. In the individual drive bumps 370a, the individual drive bump core parts 371a extend along the front-rear direction and the individual drive bump conducting films 372a are arranged at a prescribed pitch in the front-rear direction. Each of the individual drive bump conducting films 372a is electrically connected to both a corresponding individual electrode 42 and a corresponding first individual interconnect 331.

The front dummy bump core part 371c provided in the front dummy bump 370c is formed of the same material as the individual drive bump core parts 371a. The front dummy bump conducting films 372c provided in the front dummy bump 370c cover at least a portion of the front dummy bump core part 371c and are not electrically connected to any interconnect, such as the first individual interconnects 331 or bias feed interconnect 332a on the drive interconnect substrate 300 side, or any electrode, such as the drive electrodes on the channel forming substrate 20 side. The front dummy bump core part 371c extends in the left-right direction. Both ends of the front dummy bump core part 371c are respectively connected to the front ends of the left and right individual drive bump core parts 371a.

The front dummy bump conducting films 372c are arranged in the left-right direction at a pitch greater than the pitch of the individual drive bump conducting films 372a. With this construction, the front dummy bump 370c can be manufactured in the same process as the individual drive bumps 370a for the individual electrodes 42. Further, since the front dummy bump conducting films 372c are formed at a greater pitch than the individual drive bump conducting films 372a, overall manufacturing of the inkjet head 4 can be simplified.

According to this embodiment, the rear dummy bump 370d is provided between the bottom surface 302 of the drive interconnect substrate 300 and the top surface 201 of the channel forming substrate 20. The rear dummy bump 370d is positioned on the opposite side of the driver IC 120 from the front dummy bump 370c in the front-rear direction (the longitudinal direction of the drive interconnect substrate 300). This configuration can maintain good weight balance in the inkjet head 4 relative to the front-rear direction. In addition, if sealant is provided between the channel forming substrate 20 and the drive interconnect substrate 300, the rear dummy bump 370d and front dummy bump 370c can prevent the sealant from flowing out of this region.

In this embodiment, the flexible printed circuit board 125 has the proximal end 125e1 on one end in the longitudinal direction (its extending direction) that connects to the control circuit 400, and the distal end 125e2 on the opposite end in the longitudinal direction from the proximal end 125e1. The flexible printed circuit board 125 is bonded to the drive interconnect substrate 300 at an area adjacent to the distal end 125e2 in the longitudinal direction. In the area that the flexible printed circuit board 125 is bonded to the drive interconnect substrate 300, the direction in which the flexible printed circuit board 125 extends from the distal end 125e2 toward the proximal end 125e1 matches the direction in which the drive interconnect substrate 300 extends from the front end 310 toward the rear end 320. Through this configuration, the inkjet head 4 as a whole can be made more compact.

In this embodiment, the top surface 301 of the drive interconnect substrate 300 has the inclined region 315 that slopes relative to both the thickness direction and the longitudinal direction. The inclined region 315 is positioned on the front end 310 side of the driver IC 120 in the front-rear direction and includes at least the bonding area S. This configuration can reduce the bonding margin in a plan view, thereby enabling the inkjet head 4 to be made more compact. Further, since there is no need to reduce the radius of curvature in the bend of the flexible printed circuit board 125, this arrangement can prevent the flexible printed circuit board 125 from peeling off the drive interconnect substrate 300 due to stress produced in the bend.

In this embodiment, the inclined region 315 extends to the front end 310 in the front-rear direction. In the inclined region 315, the top surface 301 slopes so as to approach the bottom surface 302 vertically while moving closer to the front end 310. This arrangement can improve the ease of operations by facilitating insertion of a pressing jig.

<Variations of the Embodiment>

Figure 9:
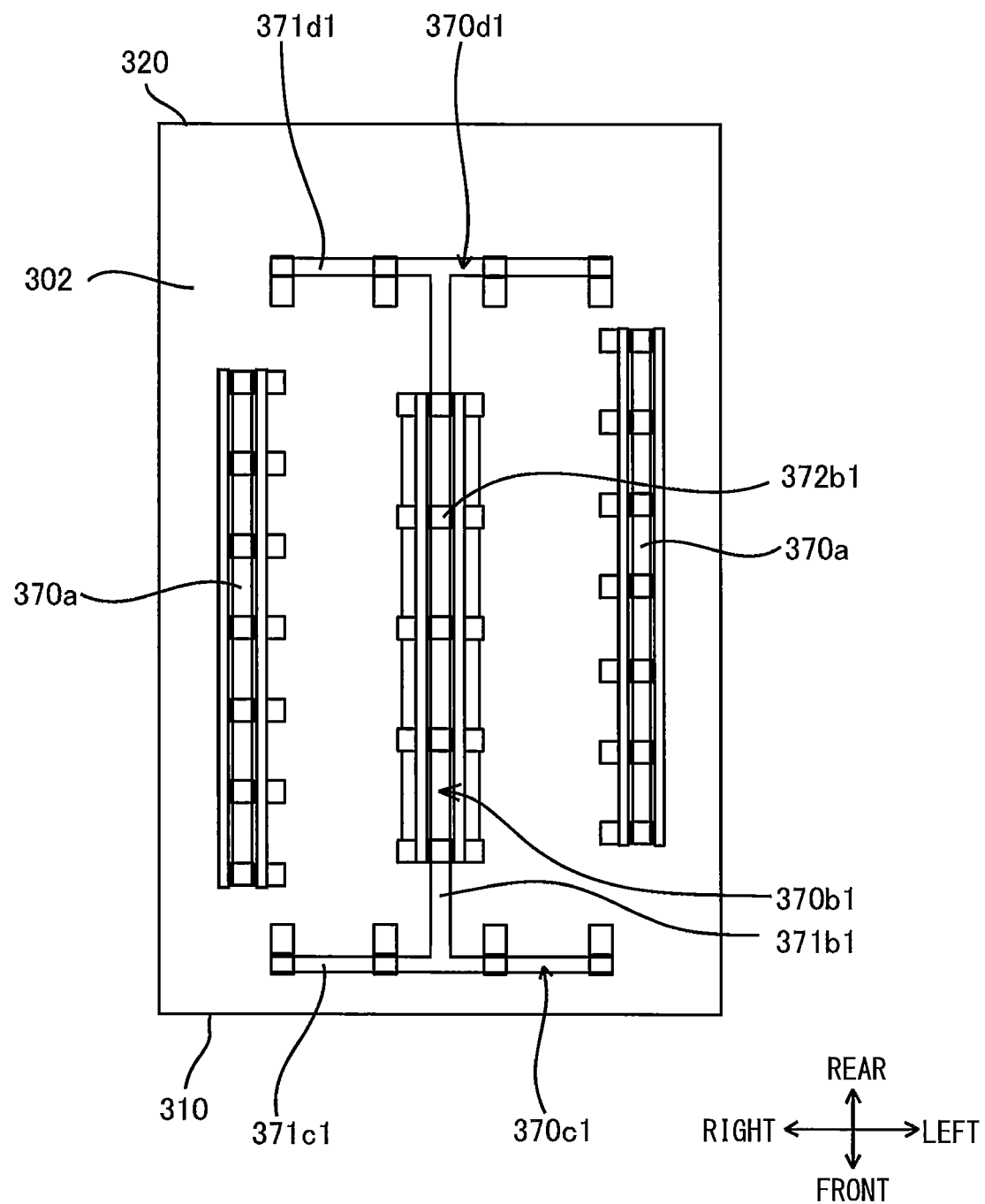
FIG. 9 is a bottom view showing a modification of a drive interconnect substrate according to an embodiment.

In the embodiment described above, the front dummy bump core part 371c and rear dummy bump core part 371d are connected to the individual drive bump core parts 371a provided on both the left and right sides. However, as shown in the variation of FIG. 9, a common drive bump core part 371b1 of the common drive bump 370b1 may be further extended in the front-rear direction and connected to both the front dummy bump core part 371c1 of the front dummy bump 370c1 and the rear dummy bump core part 371d1 of the rear dummy bump 370d1.

In this variation, the plurality of piezoelectric elements 41 are provided on the top surface 201 of the channel forming substrate 20. Further, the common electrode 43 provided in common for all piezoelectric elements 41 and for driving the same is provided on the top surface 201 of the channel forming substrate 20. The common electrode 43 extends in the front-rear direction. The drive interconnect substrate 300 is provided with the bias feed interconnect 332a corresponding to the common electrode 43. The common drive bump core part 371b1 extends in the front-rear direction. Common drive bump conducting films 372b1 are arranged along the common drive bump core part 371b1 and are electrically connected to both the common electrode 43 and the bias feed interconnect 332a. The front dummy bump core part 371c1 extends in the left-right direction. The left-right center portion of the front dummy bump core part 371c1 is connected to the front end of the common drive bump core part 371b1. The rear dummy bump core part 371d1 extends in the left-right direction. The left-right center portion of the rear dummy bump core part 371d1 is connected to the rear end of the common drive bump core part 371b1 which is extended rearward. Hence, the front dummy bump 370c1 and rear dummy bump 370d1 can be manufactured in the same process as the common drive bump 370b1 for the common electrode 43.

Figure 10:
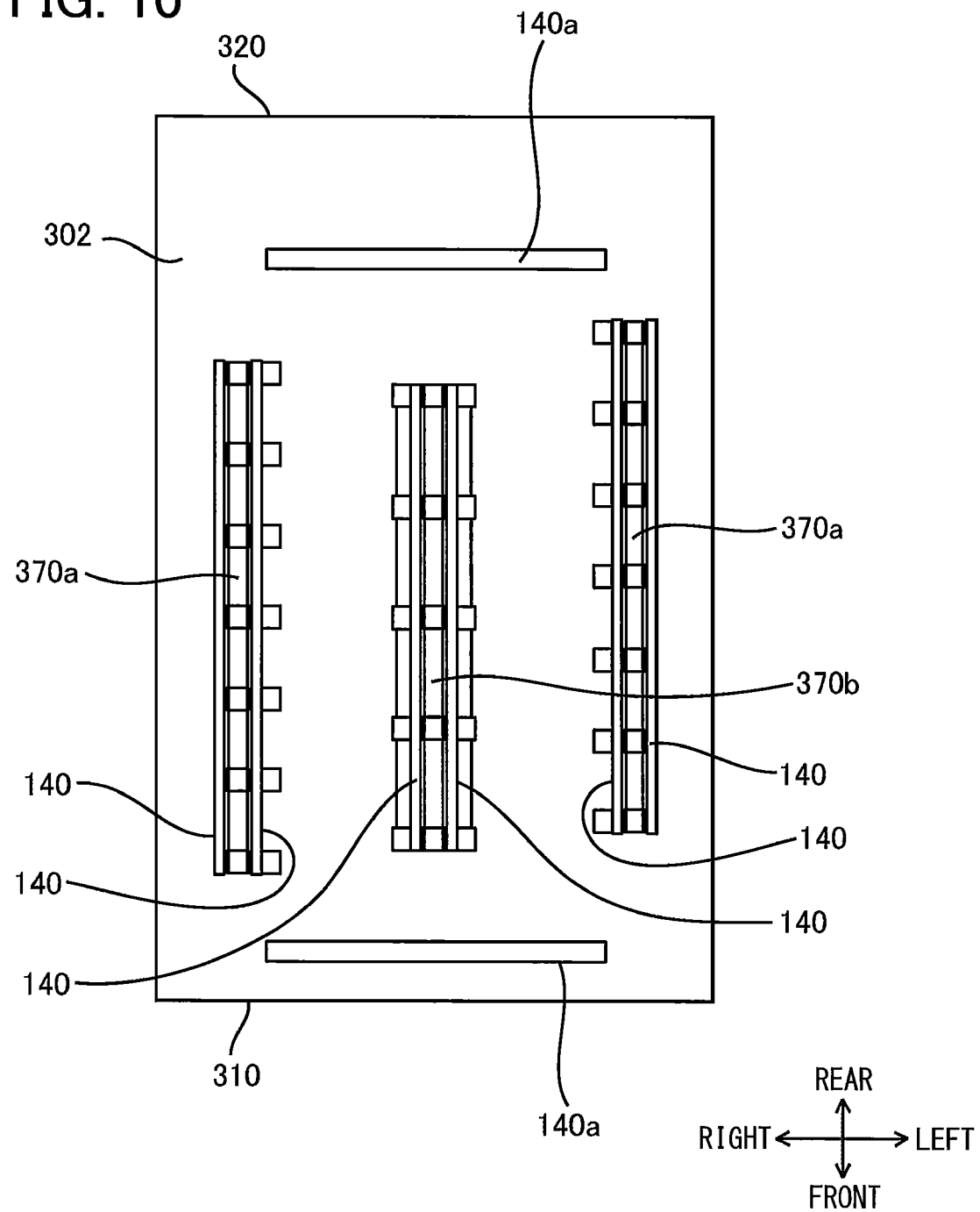
FIG. 10 is a bottom view showing another variation of a drive interconnect substrate according to an embodiment.

In another variation of the embodiment shown in FIG. 10, additional spacers 140a may be provided in place of the front dummy bump 370c and rear dummy bump 370d. The additional spacers 140a can be formed of the same material as the spacers 140. The additional spacers 140a may be formed in the same positions and regions as the front dummy bump 370c and rear dummy bump 370d of the embodiment. The additional spacers 140a function as support columns in the same way as the front dummy bump 370c and rear dummy bump 370d of the embodiment In this variation, the additional spacers 140a are provided along each of the front end 310 and rear end 320 of the drive interconnect substrate 300 between the bottom surface 302 of the drive interconnect substrate 300 and the top surface 201 of the channel forming substrate 20, in addition to the spacers 140 formed of resin that are disposed adjacent to each of the individual drive bumps 370a and common drive bump 370b. Since the additional spacers 140a are formed of the same material as the spacers 140, the additional spacers 140a can be manufactured in the same process as the spacers 140.

While the embodiment and its variations described above apply the liquid ejecting device of the present invention to an inkjet head, the composite substrate of the invention is not limited to devices used in applications that apply pressure to a liquid. The present invention may be used in other applications, such as displacing or generating vibrations in a plurality of solid driving objects by arranging a plurality of piezoelectric elements on a substrate and driving the piezoelectric elements with a driver IC to deform the substrate.

What is claimed is:

1. A composite substrate comprising:
   a first substrate having a surface;
   an actuator element provided at the surface of the first substrate;
   a second substrate having a first surface and a second surface opposite to the first surface in a thickness direction, the second substrate extending in a longitudinal direction perpendicular to the thickness direction, the second substrate having a first end and a second end in the longitudinal direction, the second surface facing the surface of the first substrate with a gap therebetween, and the second substrate being provided with a driver circuit on the first surface;
   a flexible print circuit board having a portion bonded to a position on the first surface between the first end and the driver circuit in the longitudinal direction, a bonding region being defined on the first surface as such a region to which the portion of the flexible print circuit board is bonded; and
   a support member provided between the surface of the first substrate and the second surface of the second substrate, the support member overlapping an entire part of the bonding region on the first surface, as viewed in the thickness direction.

2. The composite substrate according to claim 1, further comprising:
   a first interconnect provided at the surface of the first substrate, the first interconnect being configured to supply a drive signal to the actuator element for driving the actuator element:
   a second interconnect provided to the second substrate, the second interconnect being electrically connected to the driver circuit, and
   a bump provided between the second surface of the second substrate and the surface of the first substrate, the bump comprising:
      a first insulation core formed of an electrically insulating material, and
      a first electrically conductive film covering at least a part of the first insulation core, the first electrically conductive film being electrically connected to both of the first interconnect and the second interconnect.

3. The composite substrate according to claim 2, wherein the support member has at least a portion formed from a material identical with the material of the first insulation core.

4. The composite substrate according to claim 3, wherein the actuator element comprises a plurality of actuator elements provided at the surface of the first substrate,
   the first interconnect comprises a plurality of individual electrodes positioned on the surface of the first substrate and arrayed in the longitudinal direction, each of the individual electrodes being configured to drive a corresponding one of the plurality of actuator elements, and
   the second interconnect comprises a plurality of second interconnects in one-to-one correspondence with the plurality of individual electrodes, the plurality of second interconnects being arrayed in the longitudinal direction, wherein
   the first insulation core extends in the longitudinal direction,
   the first electrically conductive film comprises a plurality of first electrically conductive films arranged with each other in the longitudinal direction and along the first insulation core, each of the plurality of first electrically conductive films being electrically connected to a corresponding one of the individual electrodes and a corresponding one of the plurality of second interconnects, and wherein
   the support member comprises a second insulation core and a plurality of second electrically conductive films, the second insulation core being formed of a material identical with the material of the first insulation core, the plurality of second electrically conductive films covering at least a part of the second insulation core, the plurality of second electrically conductive films being non-conductive to the plurality of individual electrodes and the plurality of second interconnects.

5. The composite substrate according to claim 4, wherein the second insulation core extends in a short side direction perpendicular to the longitudinal direction and the thickness direction, the second insulation core being connected to the first insulation core, wherein
   the plurality of second electrically conductive films are arranged with each other in the short side direction and along the second insulation core, a distance between centers in the short side direction of neighboring two second electrically conductive films being greater than a distance between centers in the longitudinal direction of neighboring two first electrically conductive films.

6. The composite substrate according to claim 3, wherein the actuator element comprises a plurality of actuator elements provided on the surface of the first substrate,
   the first interconnect comprises a common electrode provided on the surface of the first substrate, the common electrode extending in the longitudinal direction, the common electrode being configured to drive the plurality of actuator elements in common, and wherein
   the second interconnect is in association with the common electrode.

7. The composite substrate according to claim 6, wherein the first insulation core extends in the longitudinal direction,
   the first electrically conductive film is electrically connected to both of the common electrode and the second interconnect, and wherein
   the support member comprises a second insulation core formed of a material identical with the material of the first insulation core, the second insulation core extending in a short side direction perpendicular to the longitudinal direction and the thickness direction, and the second insulation core being connected to the first insulation core.

8. The composite substrate according to claim 2, further comprising a spacer provided between the second surface of the second substrate and the surface of the first substrate at a position adjacent to the bump, the spacer being made from an electrically insulating material;

wherein the support member is made from a material identical to the material of the spacer.

9. The composite substrate according to claim 1, further comprising an additional support member provided between the second surface of the second substrate and the surface of the first substrate, the additional support member being positioned opposite to the support member with respect to the driver circuit in the longitudinal direction.

10. A composite substrate, comprising:
a first substrate having a surface;
a second substrate having a first surface and a second surface opposite to the first surface in a thickness direction, the second substrate extending in a longitudinal direction perpendicular to the thickness direction, the second substrate having a first end and a second end in the longitudinal direction, the second surface facing the surface of the first substrate with a gap therebetween, and the second substrate being provided with a driver circuit on the first surface;
a flexible print circuit board having a portion bonded to a position on the first surface between the first end and the driver circuit in the longitudinal direction, a bonding region being defined on the first surface as such a region to which the portion of the flexible print circuit board is bonded; and
a support member provided between the surface of the first substrate and the second surface of the second substrate, the support member overlapping an entire part of the bonding region on the first surface, as viewed in the thickness direction,
wherein the flexible print circuit board has a distal end and a proximal end opposite to the distal end in an extending direction of the flexible print circuit board, the proximal end being connected to a control circuit, wherein
the portion of the flexible print circuit board is adjacent to the distal end, wherein
in the bonding region, a direction from the distal end to the proximal end is coincident with a direction from the first end to the second end of the second substrate.

11. The composite substrate according to claim 10, wherein the first surface of the second substrate has an inclined region sloping with respect to both of the thickness direction and the longitudinal direction, the inclined region is positioned closer to the first end than the driver circuit is to the first end in the longitudinal direction, and contains the bonding region.

12. The composite substrate according to claim 11, wherein the inclined region extends to the first end in the longitudinal direction, the inclined region being sloped to approach the second surface in a direction toward the first end in the longitudinal direction.

* * * * *